US005694296A

United States Patent [19]

Urbish et al.

[11] Patent Number: 5,694,296

[45] Date of Patent: Dec. 2, 1997

[54] MULTIPOINT ELECTRICAL INTERCONNECTION HAVING DEFORMABLE J-HOOKS

[75] Inventors: Glenn F. Urbish, Coral Springs; Robert W. Pennisi; William Boone Mullen, III, both of Boca Raton; Robert W. Shisler, Parkland, all of Fla.; Richard A. Ceraldi, Austin, Tex.

[73] Assignee: Motorola, Inc., Schaumburg, Ill.

[21] Appl. No.: 575,945

[22] Filed: Dec. 20, 1995

[51] Int. Cl.$^6$ .............................. H01R 9/09; H01R 13/33; H05K 7/02

[52] U.S. Cl. .............................. 361/774; 174/260; 174/261; 361/760; 361/776; 361/782; 439/66; 439/291

[58] Field of Search .................... 128/DIG. 15; 174/259, 174/254, 260, 261; 361/760, 749, 772–774, 776, 779, 782, 783, 807, 809, 811; 439/66, 74, 284, 67, 290, 77, 291, 81, 371; 403/364, 345

[56] References Cited

U.S. PATENT DOCUMENTS

| | | | |
|---|---|---|---|
| 3,585,569 | 6/1971 | Moran | 439/371 |
| 3,842,189 | 10/1974 | Southgate | 174/260 |
| 4,191,950 | 3/1980 | Levin et al. | 128/DIG. 15 |
| 4,239,046 | 12/1980 | Ong | 128/DIG. 15 |
| 4,793,814 | 12/1988 | Zifcak et al. | 439/66 |
| 5,136,470 | 8/1992 | Sheridon et al. | 361/749 |
| 5,457,610 | 10/1995 | Bernardoni et al. | 361/816 |
| 5,561,594 | 10/1996 | Wakefield | 361/772 |

*Primary Examiner*—Donald Sparks
*Attorney, Agent, or Firm*—Dale W. Dorinski

[57] ABSTRACT

A multipoint electrical interconnection (10) provides a plurality of electrical pathways between electrically conductive hooks (15) on a substrate (12) and an electrical component (50). A plurality of electrically conductive hooks generally formed in the shape of a 'J' have a head portion (20) affixed to the substrate such that a hook portion (17) protrudes above the substrate. An electrically conductive portion of a component is disposed against the substrate such that it contacts at least three of the electrically conductive hooks and deforms the hooks. The deformed hooks provide a spring force to effect a multipoint electrical connection.

11 Claims, 4 Drawing Sheets

MULTIPOINT ELECTRICAL INTERCONNECTION HAVING DEFORMABLE J-HOOKS

CROSS REFERENCE TO RELATED APPLICATIONS

This application is related to U.S. Pat. No. 5,457,610, issued Oct. 10, 1995 by Bernardoni, et al., entitled "Low Profile Mechanical Interconnect System Having Metallized Loop and Hoop Area," and assigned to Motorola, Inc., and to U.S. application Ser. No. 08/575,652 filed Dec. 20, 1995, by Urbish, et al., entitled "Solderless Electrical Interconnection," filed concurrently herewith, and assigned to Motorola, Inc.,

TECHNICAL FIELD

This invention relates in general to electrical interconnections and more particularly to electrical contacts having multipoint interconnections.

BACKGROUND

Electrical interconnections employing mechanical force to effect the connection between one member and a second member are well known and are found in innumerable forms and configurations. All mechanical switches employ some sort of a mechanical/electrical interconnection whereby one member is brought to temporarily bear against a second member to effect an electrical connection.

In other examples, batteries are typically connected to the electrical device by means of mechanical clamps, such as the battery clamps used in an automobile battery to connect the battery cable to the battery posts, or simple spring clips used in portable electronic devices to maintain contact force against the exterior electrodes of the battery. These types of contacts and various applications are so well known that the user takes it for granted that the mechanical contact will function flawlessly.

However, those skilled in the art have long appreciated the fact that in all of these configurations there is only one point of contact between the first member and the second member. That is, no matter how carefully the two members are machined or fabricated, when examined on a micro scale, there is only a single point of contact between the two surfaces. With only one point of contact, this type of system is prone to corrosion and reliability problems, in that any foreign material deposited at the point of contact results in the circuit not being properly closed. In other cases, high levels of current across a very small contact area results in a rapid oxide buildup which diminishes the conductivity and reliability of the contact.

Thus, an extensive amount of effort has gone into research and development for ways to effect a superior contact. One solution to this dilemma is the classical gas-tight connection wherein a attempt is made to create a hermetic seal at the point of contact. Another solution has been to create a wiping contact wherein the first member wipes across the second member each time the contact is made, thus cleaning off and removing any foreign materials or oxides with every opening and closing of a switch. While both of these solutions have improved the state of the art, they are not universally applicable due to the constraints needed to provide wiping surfaces and the limited selection of materials that provide hermeticity. For example, wiping contacts are typically only useful when the mating surfaces are plated with tin. In other applications with other materials, this type of contact becomes self destructive.

However, even wiping contacts and gas-tight connections still suffer from the drawback of only having one point of contact. Another problem with the conventional contacting system is that when the assembly is subjected to vibration, the vibratory forces may be strong enough to cause the two members to become momentarily separated. In high-performance applications such as microcomputers and microcontrollers, it is critical that a continuous voltage supply be maintained, and even nanosecond discontinuities in the supply circuit can result in catastrophic failure of the device.

Clearly it would be desirable if a novel contacting scheme could be created that would solve this classical problem in the contacting art. Such a system could employ wide use and application in systems having critical needs under vibratory conditions.

DETAILED DESCRIPTION OF THE PREFERRED EMBODIMENT

A multipoint electrical interconnection provides a plurality of electrical pathways between electrically conductive hooks on a substrate and an electrical component. A plurality of electrically conductive hooks generally formed in the shape of a 'J' have a head portion affixed to a substrate such that a hook portion protrudes above the substrate. An electrically conductive portion of a component is disposed against the substrate such that it contacts at least three of the electrically conductive hooks and deforms the hooks. The deformed hooks provide a spring force to effect a multipoint electrical connection.

Figure 1:
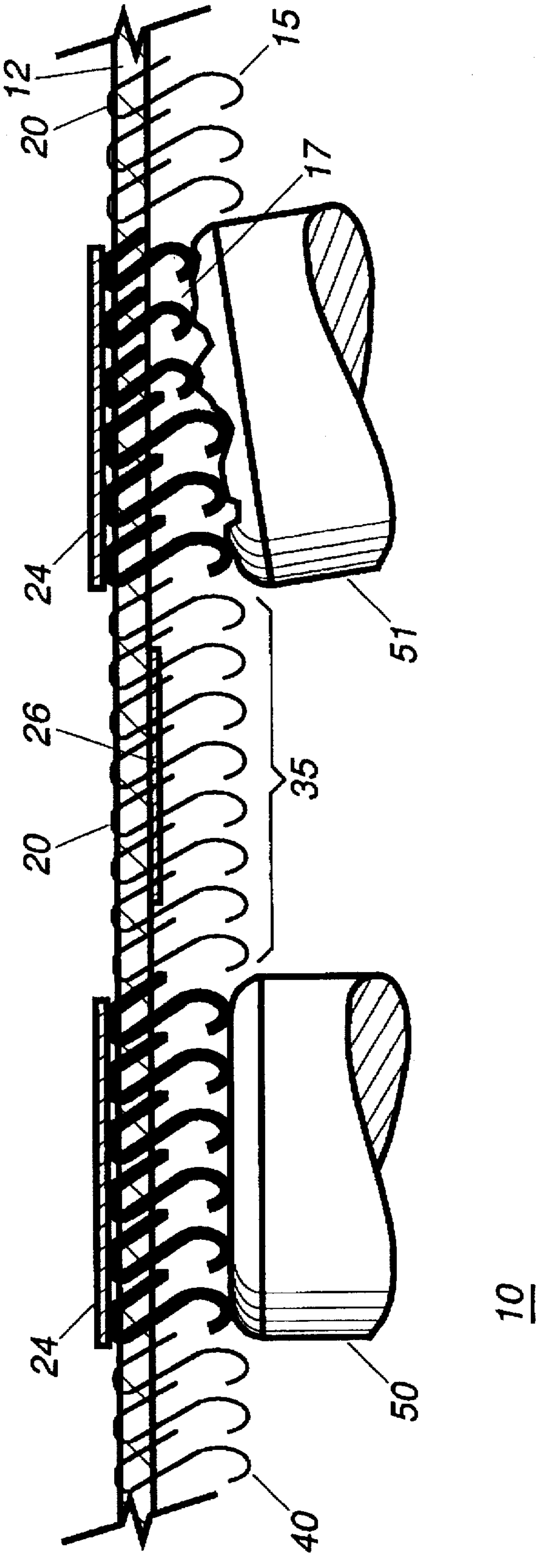
FIG. 1 is a partial cross-sectional view of a multipoint electrical contact in accordance with the invention.

While the specification concludes with claims defining the features of the invention that are regarded as novel, it is believed that the invention will be better understood from a consideration of the following description in conjunction with the drawing figures, in which like reference numerals are carried forward. Referring now to FIG. 1, the multipoint electrical interconnection 10 is made by using a myriad of electrically-conductive hooks 15 attached to a substrate 12. In the preferred embodiment, the hooks and the substrate are the well-known VELCRO® material which is variously known to those skilled in the art as hook-and-loop or hook-and-pile fastening systems. The hooks referred to herein are the classical hooks on one half of the VELCRO® fastening system and are essentially a large array of miniature hooks roughly formed in the shape of the letter "J." The upper or head portion 20 of the hook 15 corresponding to the top of the letter "J" is attached to one side of the substrate 12 and the lower portion 17 of the hook corresponding to the bottom end or curved portion of the letter "J" is suspended in space such that it protrudes above the plane of the substrate. The substrate 12 is typically a woven material, as those familiar with VELCRO® will readily appreciate. However, other non-woven systems can also be used, if appropriately designed. In both cases, the substrate can be either an electrical insulator or and electrical conductor, again, depending on the configuration desired by the designer. By creating the hooks 15 in a manner such that they are electrically conductive, one half of the typical VELCRO® fastening system, i.e., the hook portion of the hook-and-loop fastener, is used to effect a multipoint electrical interconnection. When viewed on a micro scale, the hook fasteners are essentially miniature springs that are attached to a substrate, and since the hook fasteners are arrayed so close together, typically 1.2–2.0 mm apart in both the "x" and "y" direction, that when the substrate is brought into contact with another member 50 such as a terminal of a battery, a plurality of the hooks serves to provide electrical contact between the substrate and the contact point on the battery terminal. Since each of the hook portions of the hook fastener act as separate miniature springs, they may deform in varying degrees in order to conform to the shape of the member being contacted. Note that the contact 50 in FIG. 1 is flat and essentially parallel to the substrate 12, and the hooks 15 are all essentially equally compressed. However, in most situations, the two surfaces are not perfectly parallel, (as shown by contact 51) and any misalignment is accounted for by the spring force of the various individual hooks. In situations where the surface is rough or uneven due to wear or defects, the advantage of having a plurality of contacts comes into clear view. Each individual hook is deformed just enough to provide the required contact with the member 51 at the various points on the rough, uneven surface. This spring force in the hooks provides a unique configuration for each contact situation, in that each hook has an individual, albeit small, compressive force that tends to keep it in contact with the contact member. Those skilled in the art will appreciate that although each hook provides only one point of contact between that hook and the contact member, since a multiplicity of hooks are in contact with the terminal member, in effect, there is a multiplicity of contact points—one per hook—for the entire electrical interconnection. Thus, a highly redundant interconnection is made and the failure of any individual hook to maintain contact due to relaxation of the spring force, vibration, corrosion, oxide formation, etc., has a negligible on the overall reliability of the electrical interconnection since there are so many contact points. For example, the contact surface on the negative terminal of a typical D-cell battery is approximately 300 $mm^2$, thus, over this area there would be approximately 75 hooks making contact with the battery. Thus, a highly-redundant multipoint electrical interconnection is effected.

Figure 2:
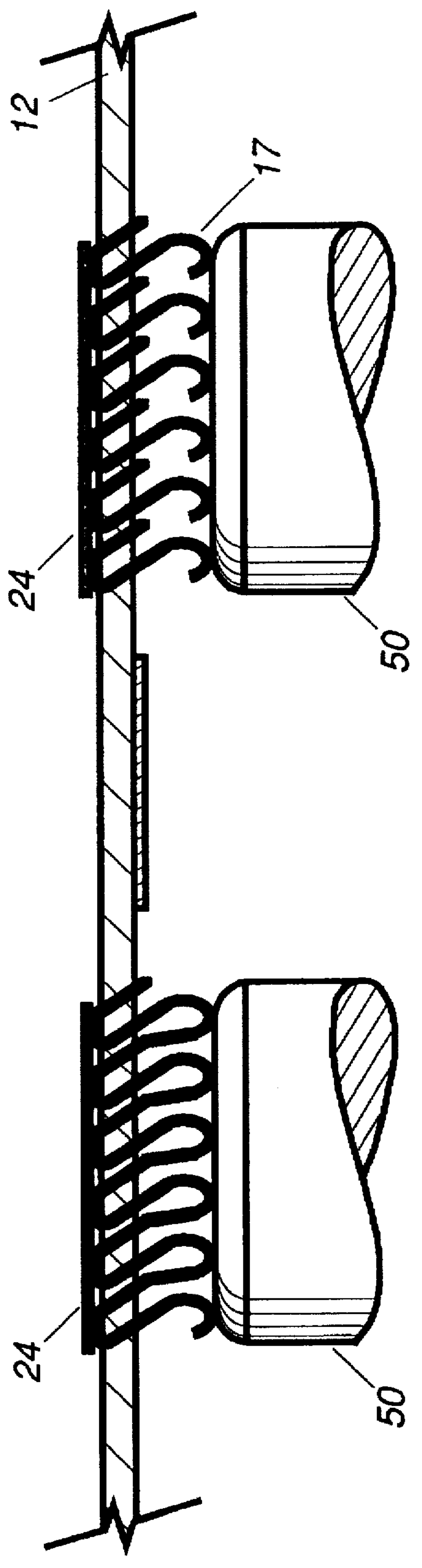
FIG. 2 is a partial cross-sectional view of another multipoint electrical contact in accordance with the invention.

Further, one or both surfaces of the substrate 12 can be selectively metallized to provide circuitry patterns 24, 26 on the top and/or bottom of the substrate. In addition, the hooks that provide the electrical contact with the second member can be selectively metallized, as shown by the darker hooks in the drawing figure. The group of hooks 35 that is not making contact with the terminal are not electrically conductive, and thus one does not have to worry about them shorting to the contact. In another embodiment shown in FIG. 2, only those hooks that are electrically conductive are present. That is, groups of hooks 35 in FIG. 1 can be removed to provide a simpler, cleaner system.

Figure 3:
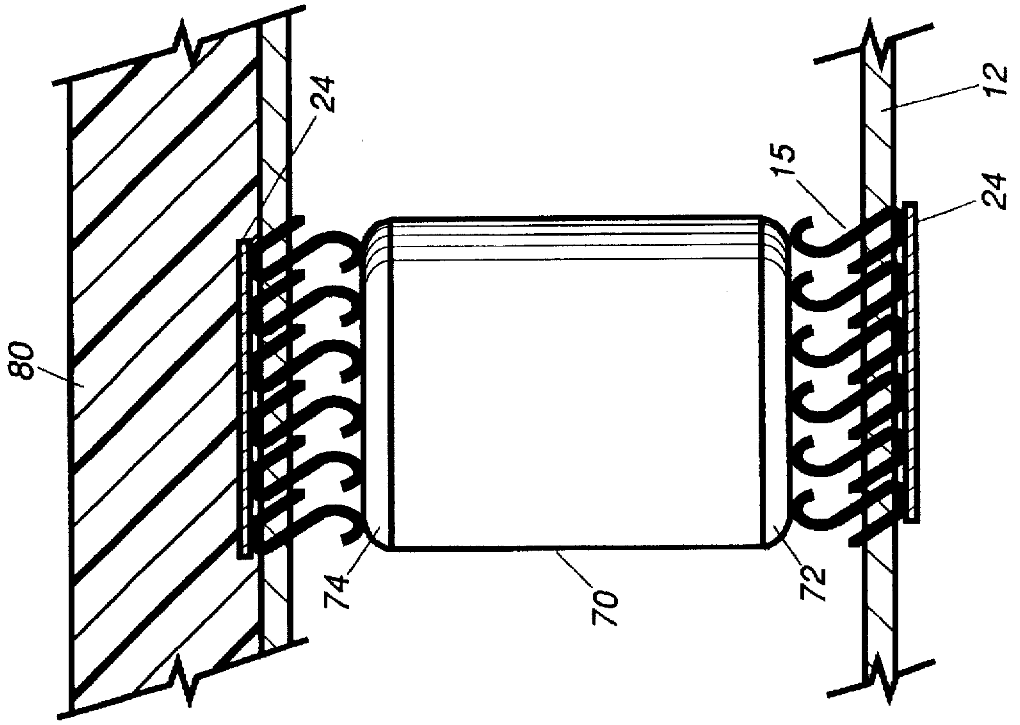
FIG. 3 is a partial cross-sectional view of still another multipoint electrical contact in accordance with the invention.

Referring now to FIG. 3, a multipoint electrical connection for a component 70 such as a battery is shown. As previously explained, the electrically conductive hooks 15 are embedded in a substrate 12 and extend above the surface of the substrate. When two sets of multipoint contacts are brought to bear against the terminals 72, 74 of the battery, a battery holder is provided. The relative spacing of the hooks on the substrate and the relative size of the battery terminals results in at least three of the hooks springing against each of the terminals at all times, thus providing a triple redundant connection at each terminal. One may, optionally, provide a backup material behind one or both of the substrates to retain the hooks against the battery. For example, a deformable material 80 such as rubber in foam or sheet form can be placed behind the substrate to provide the requisite force. Thus, each of the individual spring hooks 15 provide contact force, and the deformable material 80 also provides contact force. This type of battery holder is cheaper, lighter, and more reliable than previous versions typically found in the art. As described earlier, a circuitry pattern 24 can also be selectively placed on one or more surfaces of the substrate 12 to provide side-to-side contact in the substrate.

Figure 4:
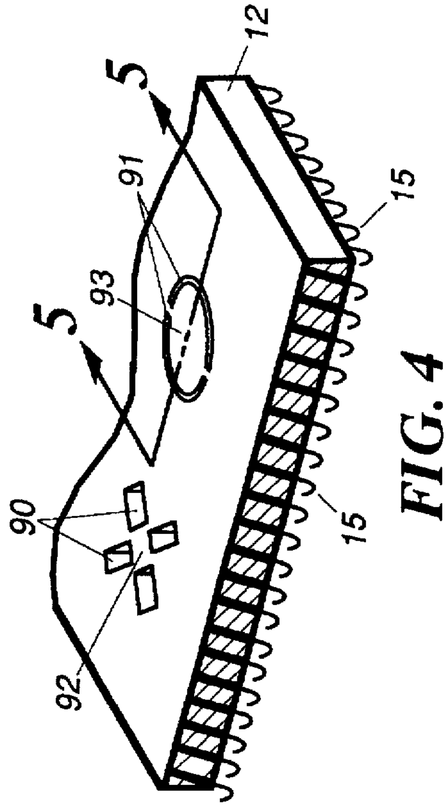
FIG. 4 is an isometric view of a substrate for a multipoint electrical contact in accordance with the invention.
Figure 5:
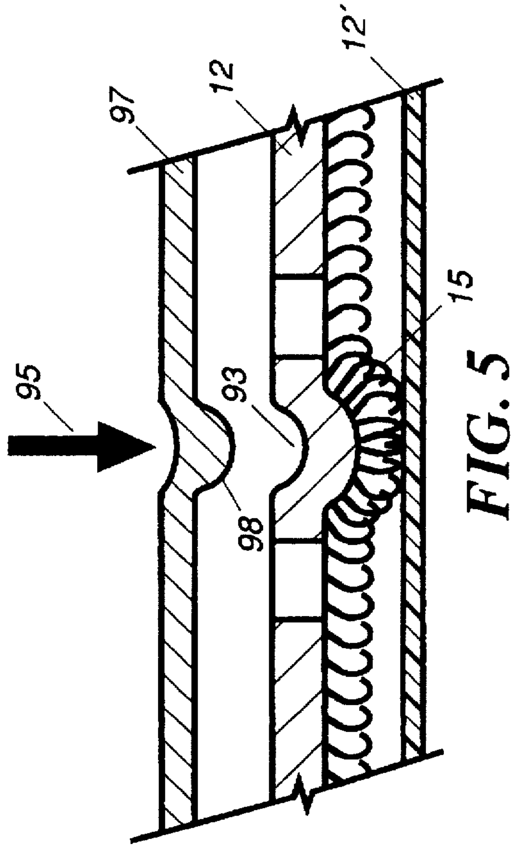
FIG. 5 is a cross-sectional view thru 5—5 of FIG. 4 in accordance with the invention.

In still another embodiment of the invention, a momentary electrical contact can be effected. In the preferred embodiment of this version, the substrate has two or more openings in it that create an island between the openings. Referring now to FIG. 4, four rectangular openings 90 are disposed such that they are arrayed around a central island 92. The reader will appreciate that although FIG. 4 shows two specific designs, a variety of designs can be employed to create the 'island' effect, for example, two hemispherical openings 91 can be arranged around a central island 93 to achieve a similar effect. The intent is to create a section of the substrate that can be easily deformed, without having to deform the surrounding areas of the substrate. The relief openings 90, 91 provide that feature. As before, the electrically conductive hooks 15 extend out from one surface of the substrate, in the area of the islands 92, 93. Referring now to FIG. 5, the above described substrate 12 is disposed above a second substrate 12' that typically has an electrically conductive circuit pattern (not shown) on the top surface. Such a circuit pattern is well known in the art, and typically consists of interdigitated fingers or a ground plane. When the island portion 91 is depressed by a force 95 from, for example, a human finger, the hooks 15 under the island make contact with the circuit pattern on substrate 12', thus effecting a momentary electrical contact. Because there are a plurality of hooks, a multipoint contact is effected, thus creating a more reliable connection. If some of the hooks become contaminated with foreign material, or if they fail to make connection, the remaining hooks will still make electrical connection to the substrate 12'. The web created by the island 91 and the openings 90 provides a restoring spring force that is counter to the force 95, thus causing the island to move away from the substrate 12' when the force 95 is removed. If the force 95 is sufficient enough, some of the hooks 15 under the island are also deformed, thus providing a system that has variable compliance. Optionally, one may also provide another substrate, such as an overlay keypad 97 on top of the substrate 12. The overlay keypad can simply be a flat sheet that serves to protect the substrate 12 and the accompanying contacts from the environment, or it can have strategically located bumps 98 that aid in depressing the island 91. The bump is situated so that it is directly above and adjacent to the island 91. The designer may optionally use a woven material or a sheet material as the substrate 12, and the substrate can be plain or have a circuitry pattern etched on one or more sides, as in the conventional flexible circuit art. Although one will typically use a dielectric material as the substrate, certain situations may find the use of an electrically conductive substrate. The hooks are typically metal wires, but they can also be plastic that is coated with metal by sputtering or plating processes.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, although the drawing figures show electrically conductive hooks, one may just as easily employ electrically conductive loops in order to create the necessary spring force. Those skilled in the art will appreciate that VELCRO® is created by weaving a material that ultimately results in the hooks in and out of the substrate to create loops that are suspended above the substrate. These loops are subsequently cut in two to create the "J" shaped hooks. If one were to avoid the cutting step and just leave the loops intact, they would provide enough spring force to effect the multipoint electrical connection in a similar manner. Obviously, one must then address the issue of continuous loops. In summary, a multipoint electrical contacting system has been shown that provides a large degree of redundancy to create a cheaper, more reliable electrical connection. This type of system can be used to effect, for example, a battery holder or a momentary contact such as a keypad. The spring force provided by the individual hooks creates variable compliance in the contacting scheme. The limitations of the prior art, such as single point contacts are overcome in a unique and novel way.

What is claimed is:

1. A multipoint electrical interconnection for providing a plurality of electrical pathways between electrically conductive hooks on a substrate and a battery, comprising:

first and second substrates each having a plurality of electrically conductive hooks generally formed in the shape of a 'J' and having a head portion and a hook portion, the head portion affixed to each substrate such that the hook portion protrudes above each respective substrate;

deformable support member behind the first substrate or the second substrate;

a battery having positive and negative terminals; and the battery disposed between the first and second substrates such that each terminal contacts and deforms at least three of the plurality of electrically conductive hooks on each substrate, the deformed hooks providing a spring force to effect a multipoint electrical connection.

2. A multipoint electrical interconnection for providing a momentary electrical contact between electrically conductive hooks on a substrate and an electrical component, comprising:

a first substrate having two or more openings therein, said openings arranged to form an island bounded by the openings, said island being connected to the substrate by two or more webs;

a plurality of electrically conductive hooks generally formed in the shape of a 'J' and having a head portion and a hook portion;

the head portion affixed to a first surface of said island such that the hook portion protrudes beyond the first surface;

a second substrate having an electrically conductive portion;

the first substrate disposed to be adjacent to the second substrate such that the electrically conductive hooks face the electrically conductive portion; and such that an electrical connection is made between the electrically conductive hooks on the first substrate and the electrically conductive portion on the second substrate when the island is urged towards the second substrate in a manner sufficient to cause the hook portion to contact the second substrate.

3. The multipoint electrical interconnection as described in claim 2, wherein the webs provide a restoring spring force when the island is urged towards the second substrate.

4. The multipoint electrical interconnection as described in claim 2, wherein the electrically conductive hooks are deformed when the electrical connection is made.

5. The multipoint electrical interconnection as described in claim 2, further comprising an overlay keypad situated adjacent to a second side of the first substrate.

6. The multipoint electrical interconnection as described in claim 5, wherein the overlay keypad has a bump corresponding to the island, said bump disposed on a side of the keypad adjacent to the first substrate.

7. The multipoint electrical interconnection as described in claim 2, further comprising a circuit pattern selectively metallized on the first substrate, the circuit pattern electrically connected to the plurality of electrically conductive hooks.

8. The multipoint electrical interconnection as described in claim 2, wherein the substrate is an electrical insulator.

9. The multipoint electrical interconnection as described in claim 8, wherein the substrate is a woven material.

10. The multipoint electrical interconnection as described in claim 9, wherein the substrate and electrically conductive hooks comprise VELCRO® having an electrically conductive coating.

11. The multipoint electrical interconnection as described in claim 2, wherein the hooks are metal wires.

* * * * *